(12) United States Patent
Song et al.

(10) Patent No.: US 10,553,531 B2
(45) Date of Patent: Feb. 4, 2020

(54) PROCESS-INVARIANT RESISTOR AND CAPACITOR PAIR

(71) Applicant: QUALCOMM Incorporated, San Diego, CA (US)

(72) Inventors: Chao Song, San Diego, CA (US); Xuhao Huang, San Diego, CA (US); Marzio Pedrali-Noy, San Diego, CA (US)

(73) Assignee: QUALCOMM Incorporated, San Diego, CA (US)

(*) Notice: Subject to any disclaimer, the term of this patent is extended or adjusted under 35 U.S.C. 154(b) by 149 days.

(21) Appl. No.: 15/710,737

(22) Filed: Sep. 20, 2017

(65) Prior Publication Data
US 2019/0089030 A1    Mar. 21, 2019

(51) Int. Cl.
| | | |
|---|---|---|
| *H01L 23/522* | (2006.01) | |
| *H01P 1/203* | (2006.01) | |
| *H05K 3/30* | (2006.01) | |
| *H01L 21/74* | (2006.01) | |
| *H01L 21/82* | (2006.01) | |
| *H01L 27/01* | (2006.01) | |
| *H01L 49/02* | (2006.01) | |

(52) U.S. Cl.
CPC ........ *H01L 23/5223* (2013.01); *H01L 21/743* (2013.01); *H01L 21/82* (2013.01); *H01L 23/5222* (2013.01); *H01L 23/5228* (2013.01); *H01L 27/016* (2013.01); *H01L 28/20* (2013.01); *H01L 28/86* (2013.01); *H01P 1/20336* (2013.01); *H05K 3/303* (2013.01); *H01L 2224/05085* (2013.01)

(58) Field of Classification Search
CPC .. H01P 1/20336; H01L 23/5222; H01L 28/20; H01L 27/016; H01L 23/5228; H01L 23/5223; H01L 28/86; H01L 21/82; H01L 21/743; H01L 2224/05085; H05K 3/303
USPC .................................................. 333/175, 185
See application file for complete search history.

(56) References Cited

U.S. PATENT DOCUMENTS

| | | | |
|---|---|---|---|
| 7,112,502 B2 | 9/2006 | Clevenger et al. | |
| 7,755,457 B2 * | 7/2010 | Lee ......................... | H01P 3/085 333/204 |
| 8,446,175 B2 | 5/2013 | Aton | |
| 9,064,719 B1 | 6/2015 | Zhou et al. | |
| 2014/0091980 A1 * | 4/2014 | Iizuka ...................... | H03H 7/40 343/860 |

(Continued)

FOREIGN PATENT DOCUMENTS

CN    103717045 A    4/2014

OTHER PUBLICATIONS

International Search Report and Written Opinion—PCT/US2018/047811—ISA/EPO—dated Nov. 9, 2018.

(Continued)

*Primary Examiner* — Robert J Pascal
*Assistant Examiner* — Jorge L Salazar, Jr.
(74) *Attorney, Agent, or Firm* — Haynes and Boone, LLP

(57) ABSTRACT

A process-invariant RC circuit is formed by patterning a metal layer using the same mask pattern to form a metal layer resistor and a metal layer capacitor. The same mask pattern results in the metal layer resistor and the metal layer capacitor each having a plurality of longitudinally-extending fingers having the same width and separation.

14 Claims, 5 Drawing Sheets

(56) References Cited

U.S. PATENT DOCUMENTS

2015/0294970 A1 10/2015 Jakushokas et al.
2016/0190076 A1 6/2016 Shimoichi et al.

OTHER PUBLICATIONS

Laurila M.M., et al., "Combination of E-Jet and Inkjet Printing for Additive Fabrication of Multilayer High-Density RDL of Silicon Interposer", IEEE Transactions on Electron Devices, IEEE Service Center, Piscataway, NJ, US, vol. 64, No. 3, Mar. 1, 2017, XP011641686, ISSN: 0018-9383, DOI: 10.1109/TED.2016.2644728 [retrieved on Feb. 23, 2017], pp. 1217-1224.
Zhou J., et al., "Compact Coplanar Filters Using Resonators with Left-Hand Characteristics", 36th European Microwave Conference 2006, IEEE, Pi, Sep. 1, 2006, pp. 332-335, XP031005568, ISBN: 978-2-9600551-6-0.

* cited by examiner

PROCESS-INVARIANT RESISTOR AND CAPACITOR PAIR

TECHNICAL FIELD

This application relates to resistor-capacitor (RC) circuits, and more particularly to a process-invariant RC circuit.

BACKGROUND

A resistor-capacitor (RC) circuit is a fundamental analog design component. The product of the resistance and capacitance for the RC circuit defines a time constant τ that defines the behavior of the RC circuit. For example, the cut-off frequency for an RC circuit used as either a low-pass filter or a high-pass filter is $1/2\pi\tau$. Since the time constant τ is such an important parameter in analog filter or delay line design, it is important that the resistance and the capacitance used to form the RC circuit have the proper values. But these resistance and capacitance values depend upon the process used to form the corresponding resistor and capacitor. The resistor and capacitor for an RC circuit may be formed using one or more metal layers for an integrated circuit. These metal layers are separated from the transistors in the semiconductor die by insulating dielectric layers.

To form a metal-layer resistor, a metal layer is patterned to form one or more conductors. The resulting resistance depends upon the width and length of the conductors or leads forming the resistor. The depth or thickness of the metal layer is determined by the semiconductor manufacturing process so a designer may tune the resistance by increasing the length or width of the leads forming the resistor. Increasing the width lowers the resistance whereas increasing the length increases the resistance. Although such design techniques are well known, the masking and processing steps are prone to process variations that cause errors in the actual resistance as compared to the desired resistance. Similar process variations apply to polysilicon resistors. A common rule of thumb for such resistance variation for polysilicon resistors is that the actual resistance will be within +/−20% of the desired resistance. For example, if the mask layout was designed to form a resistor with a resistance of 10 KΩ, the actual resistance for the resulting resistor will range from 8 K to 12 KΩ.

A similar process variation affects the capacitance for a metal layer capacitor. As opposed to a metal-insulator-metal (MIM) capacitor in which one electrode is formed in a first metal layer and a second electrode is formed in an adjacent metal layer, a metal layer capacitor is formed in the one metal layer. A metal layer capacitor may also be denoted as a metal-oxide-metal (MOM) capacitor as known in the semiconductor arts. The capacitance for a metal layer capacitor depends upon the separation between the leads forming the capacitor electrodes and their length. A designer may thus adjust the separation and length to achieve the desired capacitance. But the masking and processing steps to form the capacitor electrodes are also subject to process variation. A common rule of thumb for the resulting process variation in the capacitance is +/−20%. An RC circuit formed from a metal layer resistor and a metal layer capacitor will thus have a relatively large time constant variation. Circuit performance suffers from such a wide range in achieved time constants for metal layer RC circuits.

Accordingly, there is a need in the art for process-invariant metal layer RC circuits.

SUMMARY

To provide an RC circuit with a process-invariant time constant, the same masking pattern (or patterns) is used to pattern a metal layer adjacent a semiconductor die into a metal layer capacitor and a metal layer resistor. In particular, the masking pattern forms a metal layer into a metal layer resistor including a plurality of longitudinally-extending leads (which may also be designated as fingers) each having a first width and separated from each other by a first gap. The same masking pattern at the same time forms the metal layer into a metal layer capacitor so that both the metal layer resistor and the metal layer capacitor experience the same fabrication process and fabrication environment. As used herein, the "same masking pattern" that is also used to pattern the metal layer into the metal layer capacitor is one that produces a plurality of longitudinally-extending fingers of the same width and the same separation. In particular, the metal layer capacitor includes a first set of longitudinally-extending fingers that are interdigitated with a second set of longitudinally-extending fingers. One set forms a first terminal for the metal layer capacitor whereas the remaining set forms a second terminal for the metal layer capacitor. The interdigitation gap between opposing fingers from the two sets equals the separation between the longitudinally-extending fingers or leads forming the metal layer resistor. Since the same masking pattern at the same time forms a metal layer into both the metal layer resistor and the metal layer capacitor, the longitudinally-extending leads or fingers for both the metal layer capacitor and the metal layer resistor undergo similar process variation with regard to their resulting width and separation.

Since all the fingers have the same width and separation, process variations that affect the finger width will have an opposite effect on the separation. For example, if the masking pattern process variation results in over-etching of the metal layer such that the finger width is reduced by some factor, the separation between neighboring fingers will be increased by the same factor. The reduction in finger width results in an increase in the resistance for the metal layer resistor but this is offset by a balancing reduction in the capacitance for the metal layer capacitor. The RC time constant thus remains substantially unchanged. Similarly, if the masking pattern process variation results in under-etching of the metal layer, the finger width is increased but the gap or separation between neighboring fingers is decreased. The resistance then goes down but that is balanced by an increase in the capacitance such that the RC time constant again remains substantially unchanged.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
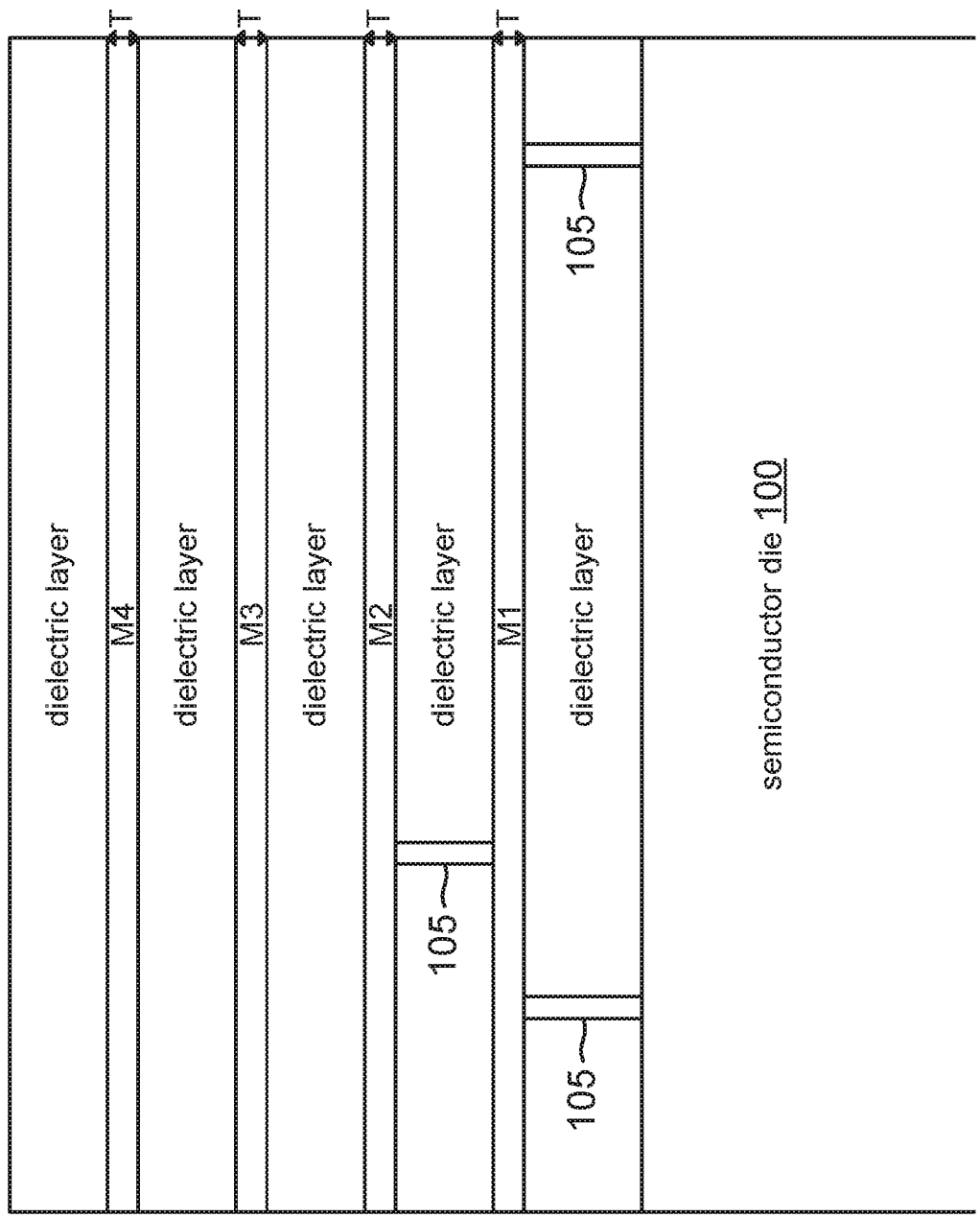
FIG. 1 is a cross-sectional view of a semiconductor die and the adjacent metal layers in an example integrated circuit including a process-invariant metal layer RC circuit in accordance with as aspect of the disclosure.

A process-invariant metal layer RC circuit is provided by utilizing the same mask pattern during the patterning of the metal layer that will include the resistor and capacitor used to form the RC circuit. As opposed to the capacitor, the metal layer lead forming a resistor is continuous between its contacts. But the contacts to the metal layer capacitor are each attached to separate metal layer leads such that one forms the a first terminal and the other forms a second terminal, there is no continuous conduction path between the capacitor contacts. So a metal layer capacitor cannot have an identical layout as a metal layer resistor. It will thus be appreciated that, as used herein, the "same mask pattern" is defined to be one that produces longitudinally-extending leads (which may also be designated as fingers) having the same width and separation from each other. Given such similarities between the metal layer resistors and capacitors, it will be shown herein that the process variation for the RC time constant becomes insignificant.

As noted above, the leads forming the metal layer capacitor may also be designated as fingers. One set of fingers are connected to a first electrode or contact whereas another set of fingers are connected to a remaining second electrode or contact. The first set of fingers is interdigitated with the second set of fingers according to an interdigitation gap that separates opposing fingers from the first and second sets. The fingers each have a certain width that is the same as the width for the continuous lead forming the metal layer resistor. Since the metal layer resistor is continuous, it cannot be interdigitated with regard to such a interdigitation gap. Instead, the metal layer resistor is folded into longitudinally-extending leads arranged in parallel such that the separation between each longitudinally-extending lead is the same as the interdigitation gap between the opposing interdigitated fingers of the metal layer capacitor. In some embodiments, the finger length for the metal layer capacitor is the same as the longitudinally-extending finger or lead length for the metal layer resistor.

The resulting patterning of the metal layer resistor and capacitor results in an RC time constant that is substantially process invariant. For example, suppose that the metal layer resistor is designed to have a certain lead width to provide the desired amount of resistance. In the same metal layer, each finger for the metal layer capacitor is then patterned to have the same width. It will depend upon the particular process node used but whatever the variation is it will also apply to the metal layer capacitor since both the metal layer capacitor and the metal layer resistor are formed from the same metal layer using the same masking pattern. In that regard, suppose further that the process variation caused the lead width to be too thin for the metal layer resistor such that its actual resistance is higher than what was desired. Since the same mask step (or steps) were used to construct the metal layer capacitor fingers, the capacitor fingers will then be too thin by the same factor. The gap between the fingers will thus increase by the same factor such that the actual capacitance for the metal layer capacitor is less than what is desired. The depth or thickness of the resulting metal traces or fingers for the metal layer resistor and metal layer capacitor will also vary in common. But note the RC time constant remains substantially unaffected since it is the product of the resistance and the capacitance. The same salutary effect occurs if the width for the leads in the metal layer resistor are too wide due to under-etching such that the actual resistance is less than what was desired. In that case, the gap between the capacitor fingers will shrink accordingly such that the actual capacitance is higher than what was desired. But the RC time constant again remains unchanged due to the countervailing effects on the resistance and the capacitance. The conventional problems with regard to wide process variance in the RC time constant for an RC circuit are thus solved. These advantageous properties may be better appreciated with reference to the following example embodiments.

An example semiconductor die 100 is shown in FIG. 1. As known in the semiconductor arts, semiconductor die 100 is processed to contain the active circuitry transistors and other active devices for the resulting integrated circuit. Die 100 is covered by metal layers such as metal layers M1, M2, M3, and M4. The actual number of metal layers in a given embodiment will depend upon the manufacturing process. For example, modern semiconductor processes produce over 10 metal layers. The four metal layers adjacent die 100 are thus merely exemplary such that it will be appreciated that additional metal layers may be patterned according to the principles disclosed herein. The metal layers are separated from each other and from die 100 by corresponding dielectric layers. Traditionally, the dielectric layers were formed with silicon dioxide but low dielectric constant materials may also be used. The metal layers are formed with a suitable metal such as aluminum or copper. Each metal layer has a thickness T. As known in the semiconductor arts, the metal layers are patterned to form the various signal, ground, and power leads for the active circuitry in die 100. In addition, a given one of the metal layers (or some or all of them) is further patterned as discussed herein to form a process-invariant RC circuit. It will be appreciated that the thickness T and the number of metal layers in a given embodiment will depend upon the particular semiconductor process being utilized to form the resulting integrated circuit. The active circuitry communicates with the leads formed in the metal layers through vias 105 such as shown extending to metal layers M1 and M2. For illustration clarity, vias to the remaining metal layers are not shown.

Figure 2:
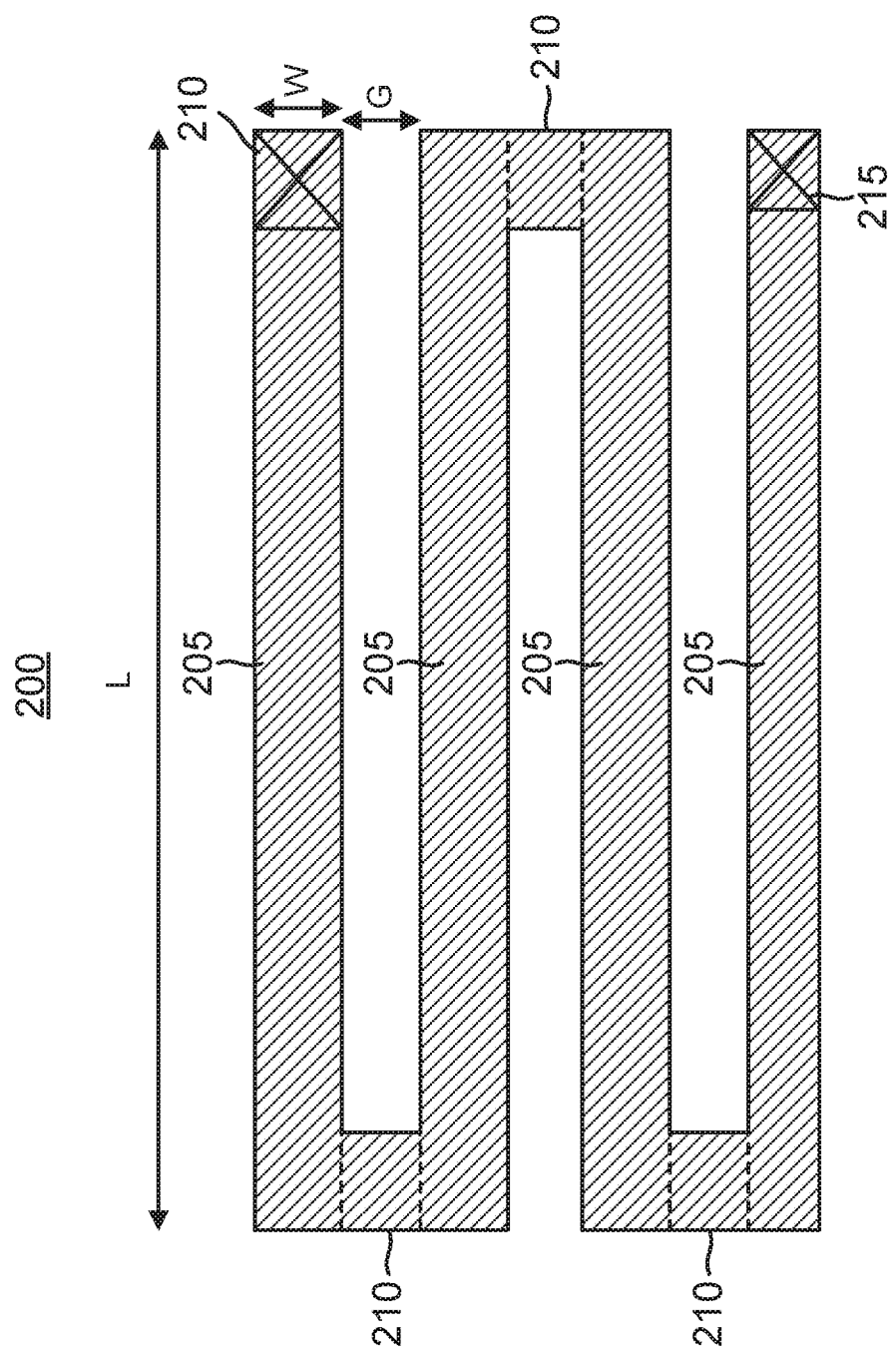
FIG. 2 is a plan view of an example metal layer resistor for a process-invariant RC circuit in accordance with an aspect of the disclosure.

An example metal layer resistor 200 is shown in FIG. 2. Referring again to FIG. 1, metal layer resistor 200 would be formed in one of the metal layers such as metal layers M1 through M4. A plurality of longitudinally-extending leads 205 are arranged in parallel. Adjacent leads 205 are joined at their ends by laterally-extending connecting leads 210. As used herein, a "laterally-extending" component is understood to be extending in a direction that is orthogonal to one that is longitudinally-extending. The resulting structure for metal layer resistor 200 may be deemed to be folded or meandering. Each longitudinally-extending lead 205 has a width W that is determined by the mask step (or steps) used to pattern the metal layer for metal layer resistor 200. Connecting leads 210 have this same width W. Each longitudinally-extending lead 205 is separated from its neighboring longitudinally-extending lead(s) 205 by a separation or gap (G). The gap G thus defines the length of each connecting lead 210. In addition, each longitudinally-extending lead has a length L1. Finally, longitudinally-extending leads 205 and connecting leads 210 have the same thickness T (FIG. 1) that depends upon the metal layer process. The parameters L1, W, and T define the resistance R for metal layer resistor 100. In particular, the resistance R is given by the following equation (1) if the current density is assumed to be uniform in metal layer resistor 200:

$$R=\rho*(N1*L1/(T*W))\qquad\text{Eq. (1)}$$

where ρ is the electrical resistivity of the metal used to form corresponding metal layer and N1 is the number of longitudinally-extending leads. This formula also assumes that the length L1 is much greater than the gap G.

Figure 3:
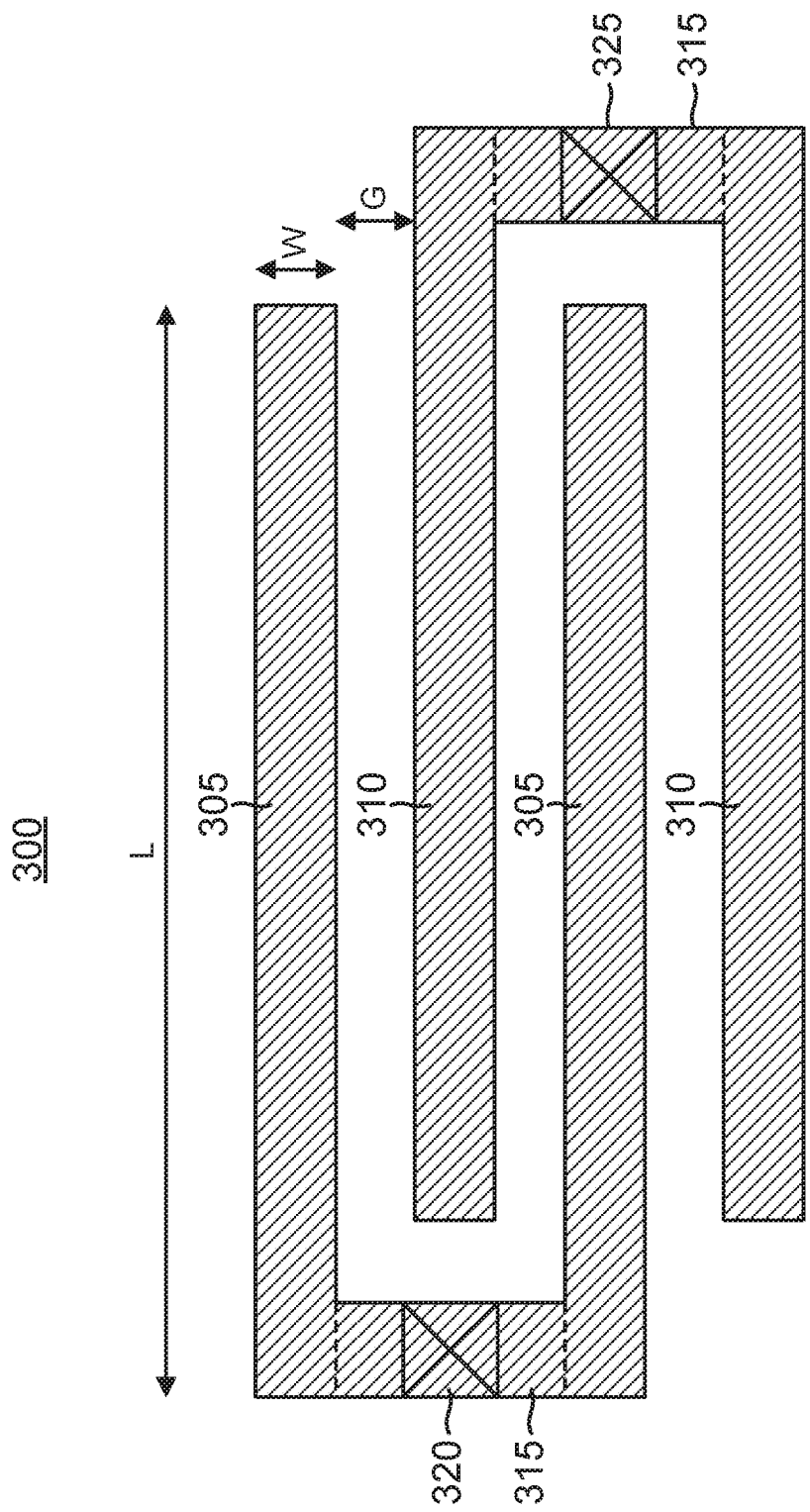
FIG. 3 is a plan view of a metal layer capacitor formed using the same masking pattern and the same metal layer and at the same time used to form the metal layer resistor of FIG. 2 in accordance with an aspect of the disclosure.

The parameters W, and G that define the patterning of the metal layer to form metal layer resistor 200 are also applied to the patterning of the same metal layer to form a metal layer capacitor 300 as shown in FIG. 3. Metal layer capacitor 300 includes a first set of longitudinally-extending fingers 305 interdigitated with another set of longitudinally-extending fingers 310. Once set forms the a first terminal whereas the remaining set forms a second terminal for metal layer capacitor 300. Within each set, the fingers are connected together by a laterally-extending lead or backbone 315. Each longitudinally-extending finger 305 and 310 may have the length L1 discussed with regard to longitudinally-extending leads 205 of metal layer resistor 200. More generally, each longitudinally-extending finger 305 and 310 may have a length L2 that may or may not equal the length L1 for fingers 205 in metal layer resistor 200. Each longitudinally-extending finger 305 and 310 has the same width W discussed with regard to longitudinally-extending leads 205. Finally, a separation of a gap G for the interdigitation of fingers 305 and 310 is the same as the gap G separating longitudinally-extending leads 205 of metal layer resistor 200. A length of each backbone 315 thus equals 2*G+W. The parameters L2, T, and W define the (vertical) capacitance. In particular, the capacitance C for metal layer capacitor 300 is given by the following equation (2):

$$C=\varepsilon*(N2*L2*T)/G\qquad\text{Eq. (2)}$$

where ε is the permittivity of the dielectric material between the interdigitated fingers 305 and 310 and N2 is the number of gaps G.

Figure 4:
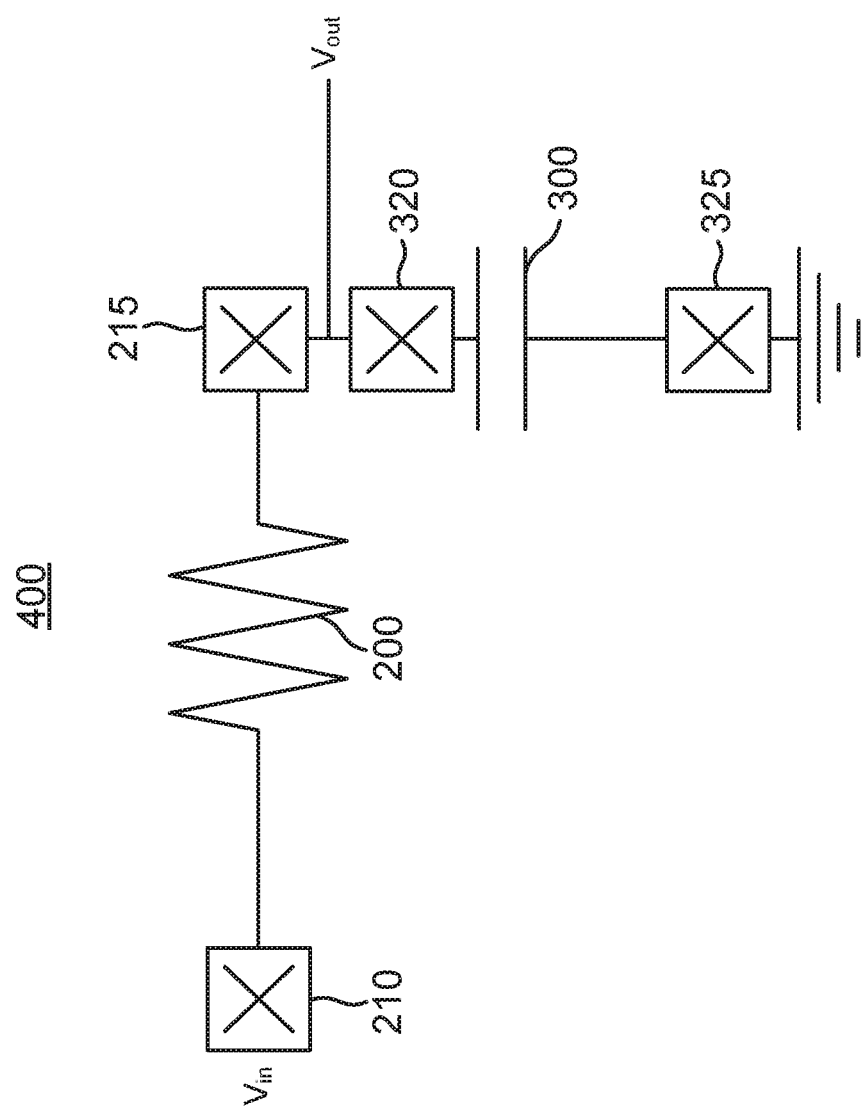
FIG. 4 is a diagram for a process-invariant RC circuit formed using the metal layer resistor of FIG. 2 and the metal layer capacitor of FIG. 3.

Metal layer resistor 200 and metal layer capacitor 300 may then be coupled together either in parallel or in serial to form an RC circuit. Such a coupling may be performed through a trace (not illustrated) formed in the same metal layer or in adjacent metal layer. An example serial RC circuit 400 is shown in FIG. 4 in which metal layer resistor 200 and metal layer capacitor 300 are connected in series. Referring again to FIGS. 1 and 2, active circuitry in die 100 may drive an input voltage Vin into metal layer resistor 200 through a via 210. An output voltage Vout is received by the active circuitry through a via 215 at another end of metal layer resistor 200. Via 215 is tied to the same circuit node as a via 320 that drives fingers 305. Fingers 310 are tied to a ground node in the active circuitry in die 100 through a via 325. From equations (1) and (2), the RC time constant τ for RC circuit 400 is given by:

$$\tau=\rho*\varepsilon*(N1*N2*L1*L2)/(W*G))\qquad\text{Eq. (3)}$$

Note that the thickness T for the metal layer does not affect the RC product. Equation (3) shows that the best process cancellation is achieved when the gap G equals the width W. Given this relationship for the RC time constant τ, suppose that due to over-etching, the width W is reduced by some arbitrary factor a % such that W becomes W(1−a %). This reduction in the width W produces a corresponding increase of a % in the gap G so that G becomes G(1+a %). The product G*W in Equation 3 is thus largely unchanged. The time constant C is thus substantially invariant with regard to over-etching. The same salutary effect occurs in the case of under-etching by the arbitrary factor a %. In that case, W becomes W(1+a %) whereas G becomes G(1−a %). But the product G*W remains substantially unchanged. The RC time constant τ is thus substantially process invariant for either a serial or parallel combination of metal layer resistor 200 and metal layer capacitor 300.

Note that the over-etching or under-etching due to process variations will also affect the lengths L1 and L2 but such changes in length may be neglected so long as these lengths are relatively large compared to such process variations. In that regard, the length L1 for metal layer resistor 200 need not be the same as the length L2 for metal layer capacitor 300 so long as both are relatively large compared to the process variations. In other embodiments, the lengths L1 and L2 are the same for both circuit elements. A method of manufacturing a process-invariant RC circuit will now be discussed.

Figure 5:
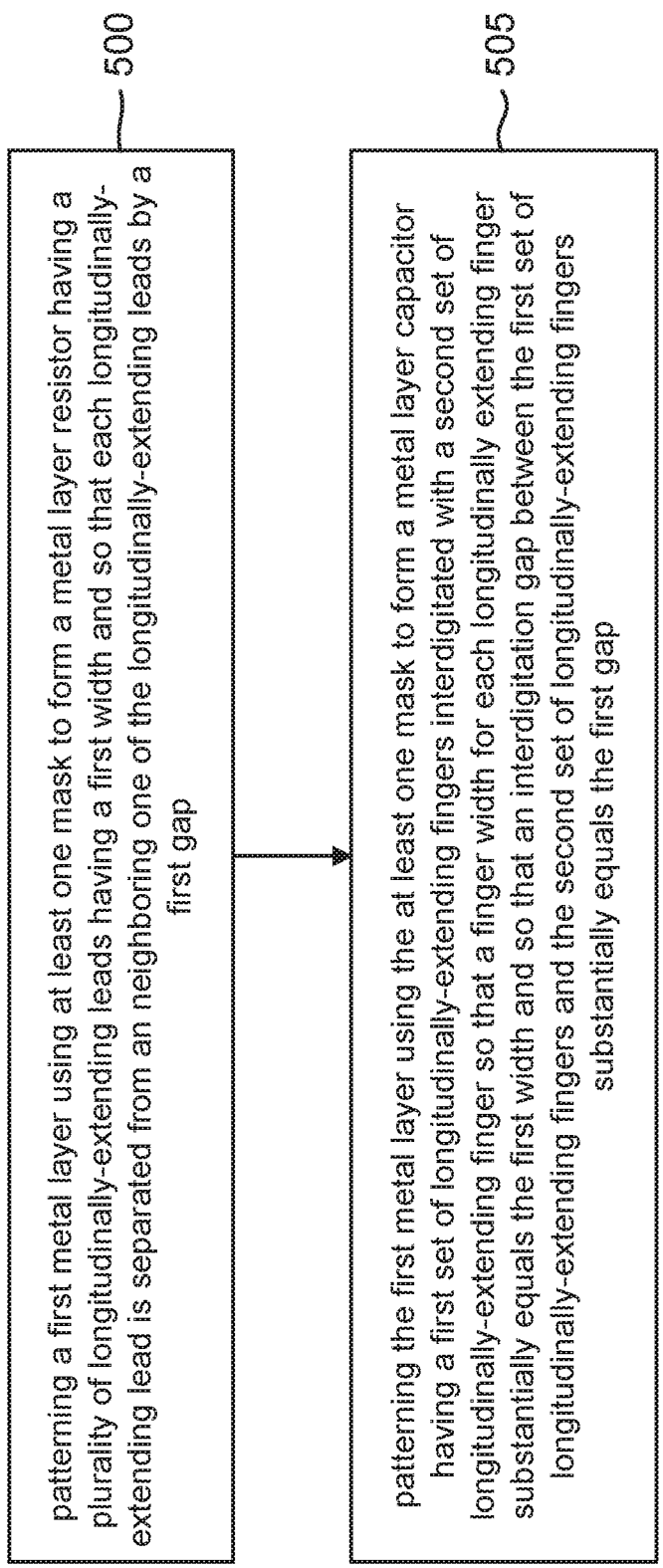
FIG. 5 is a flowchart for an example method of manufacturing a process-invariant RC circuit in accordance with an aspect of the disclosure.

A flowchart for a method of manufacturing a process-invariant RC circuit is shown in FIG. 5. The method begins with an act 500 of patterning a metal layer using at least one mask to form a metal layer resistor having a plurality of longitudinally-extending leads having a first width and so that each longitudinally-extending lead is separated from an neighboring one of the longitudinally-extending leads by a first gap. Note that such patterning may involve the etching of a pre-existing metal layer to form the longitudinally-extending leads. Alternatively, the etching may be of a dielectric layer that is then plated with metal to form the metal layer structures as known in the damascene process arts. The method also includes an act 505 that occurs simultaneously with act 500 and includes a patterning of the metal layer using the at least one mask to form a metal layer capacitor having a first set of longitudinally-extending fingers interdigitated with a second set of longitudinally-extending fingers so that a finger width for each longitudinally extending finger substantially equals the first width and so that an interdigitation gap between the first set of longitudinally-extending fingers and the second set of longitudinally-extending fingers substantially equals the first gap. Such patterning depends upon the patterning used in act 500. In other words, if act 500 involves the etching of a pre-existing metal layer, the same mask (or masks) is used to etch the metal layer to form the metal layer capacitor. Alternatively, if act 500 involved a damascene process, the same mask (or masks) would be used to form the metal layer capacitor in act 505 using the damascene process. To reduce the process variations in the RC time constant τ, the resulting metal layer capacitor and metal layer resistor should be relatively adjacent or proximate to each other.

It will be appreciated that many modifications, substitutions and variations can be made in and to the materials, apparatus, configurations and methods of use of the devices of the present disclosure without departing from the scope thereof. For example, the same pattern may be used to extend the metal layer resistor and the metal layer capacitor to additional metal layers. In other words, the metal layer resistor may include a plurality of longitudinally-extending leads in a first metal layer and also in a second metal layer. Since the same pattern is used, the longitudinally-extending leads would all still have the same width and separation. Similarly, the metal layer capacitor may include a first set of longitudinally-extending fingers interdigitated by the same gap with a second set of longitudinally-extending fingers in both the first and the second metal layers. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A resistor-capacitor (RC) circuit comprising:
a plurality of leads in a first metal layer adjacent a semiconductor die, wherein the plurality of leads are configured into a metal layer resistor and configured into a metal layer capacitor that is coupled to the metal layer resistor, and wherein the plurality of leads have the same width; and wherein the plurality of leads includes a plurality of longitudinally-extending leads, a first set of longitudinally-extending fingers, and a second set of longitudinally-extending fingers;
the metal layer resistor including the plurality of longitudinally-extending leads, the plurality of longitudinally-extending leads being arranged in parallel according to a first gap between neighboring ones of the longitudinally-extending leads and coupled to each other; and
the metal layer capacitor including the first set of longitudinally-extending fingers and the second set of longitudinally-extending fingers, wherein the first set of longitudinally-extending fingers are interdigitated with the second set of longitudinally-extending fingers according to an interdigitation gap, and wherein the interdigitation gap equals the first gap.

2. The RC circuit of claim 1, wherein the metal layer resistor includes a plurality of laterally-extending connectors configured to couple together the longitudinally-extending leads.

3. The RC circuit of claim 1, wherein the metal layer resistor is connected in series with the metal layer capacitor.

4. The RC circuit of claim 1, wherein the metal layer resistor is connected in parallel with the metal layer capacitor.

5. The RC circuit of claim 1, wherein the metal layer resistor further includes a plurality of longitudinally-extending leads arranged in parallel in a second metal layer adjacent the semiconductor die according to the first gap between neighboring ones of the longitudinally-extending leads in the second metal layer.

6. The RC circuit of claim 1, wherein the metal layer capacitor further includes a first set of longitudinally-extending fingers in a second metal layer adjacent the semiconductor die, wherein the first set of longitudinally-extending fingers in the second metal layer are interdigitated according to the interdigitation gap with a second set of longitudinally-extending fingers in the second metal layer.

7. The RC circuit of claim 1 wherein each longitudinally-extending lead extends across a first length, and wherein each longitudinally-extending finger extends across the first length.

8. The RC circuit of claim 1, wherein the first metal layer is an aluminum metal layer.

9. The RC circuit of claim 1, wherein the first metal layer is a copper metal layer.

10. The RC circuit of claim 1, wherein the semiconductor die includes active circuitry configured to drive an input signal through a first via into a first end of the metal layer resistor and to receive an output signal at a circuit node through a second via at a second end of the metal layer resistor.

11. The RC circuit of claim 10, wherein the circuit node is connected to the first set of longitudinally-extending fingers through a third via, and wherein the active circuitry includes a ground node connected to the second set of longitudinally-extending fingers through a fourth via.

12. A resistor-capacitor (RC) circuit, comprising:
a metal layer resistor in a first metal layer adjacent a semiconductor die, the metal layer resistor including a plurality of longitudinally-extending leads each having a first width and separated by a first gap equaling the first width; and
a metal layer capacitor in the first metal layer including at least a pair of longitudinally-extending fingers interdigitated according to the first gap with at least at least one opposing longitudinally-extending finger, wherein each longitudinally-extending finger has the first width.

13. The RC circuit of claim 12, wherein the metal layer resistor is coupled in series with the metal layer capacitor.

14. The RC circuit of claim 12, wherein the metal layer resistor is coupled in parallel with the metal layer capacitor.

* * * * *